United States Patent [19]
Flannagan et al.

[11] Patent Number: 5,173,877
[45] Date of Patent: Dec. 22, 1992

[54] BICMOS COMBINED BIT LINE LOAD AND WRITE GATE FOR A MEMORY

[75] Inventors: Stephen T. Flannagan; Tai-Sheng Feng, both of Austin, Tex.

[73] Assignee: Motorola, Inc., Schaumburg, Ill.

[21] Appl. No.: 625,173

[22] Filed: Dec. 10, 1990

[51] Int. Cl.$^5$ .............................. G11C 7/00
[52] U.S. Cl. ........................ 365/190; 365/203; 365/177
[58] Field of Search ............. 365/189.01, 189.06, 365/190, 189.11, 203, 177, 202

[56] References Cited

U.S. PATENT DOCUMENTS

| | | | |
|---|---|---|---|
| 4,402,066 | 8/1983 | Itoh et al. | 365/190 |
| 4,730,279 | 3/1988 | Ohtani | 365/203 |
| 4,866,674 | 9/1989 | Tran | 365/189.11 |
| 4,926,383 | 5/1990 | Kertis | 365/203 |
| 5,058,067 | 10/1991 | Kertis | 365/190 |

OTHER PUBLICATIONS

Tran et al., "An 8ns BiCMOS 1Mb ECL SRAM with a Configurable Memory Array Size", 1989 IEEE Solid State Circuits Conference, pp. 36-37.
Kertis et al., "A 12ns 256K BiCMOS SRAM", 1989 IEEE Solid State Circuits Conf., pp. 186-187.
Burnett and Hu, "Hot-Carrier Deg. in Bipol. Trans. at 300 and 110 K-Eft. on BiCMOS Inver. Perf.", IEEE Transactions on Electron Devices, vol. 37, No. 4, Apr. 1990, pp. 1171-1173.

Primary Examiner—Joseph A. Popek
Attorney, Agent, or Firm—Paul Polansky

[57] ABSTRACT

A BICMOS combined bit line load and write gate for a memory comprises first and second portions coupled to first and second bit lines of a bit line pair, the first and second portions each comprising first through sixth transistors. The first and second transistors are serially coupled from a power supply voltage terminal to form a CMOS inverter whose input terminal receives a local write signal and whose output terminal is coupled to the base of the fifth transistor. The third transistor has a drain coupled to the source of the second transistor, a gate for receiving the local write signal, and a source for receiving a data signal. The fourth transistor is serially coupled between the base of the fifth transistor and the source of the third transistor, with the local write signal coupled to the gate thereof. The fifth transistor has a collector coupled to the power supply voltage terminal, and an emitter coupled to a corresponding bit line. The sixth transistor receives the local write signal and is serially coupled between the power supply voltage terminal and the corresponding bit line. The BICMOS combined bit line load and write gate prevents failure due to the body effect, avoids failure due to manufacturing variations which occur due to ratioing of transistors, provides the ability to adapt the memory to different data organizations, and prevents of self boosting of the base of the fifth transistor.

6 Claims, 6 Drawing Sheets

BICMOS COMBINED BIT LINE LOAD AND WRITE GATE FOR A MEMORY

CROSS-REFERENCE TO RELATED, COPENDING APPLICATION

Related copending application is application Ser. No. 07/548,809, filed Jul. 6, 1990, by Scott G. Nogle and assigned to the assignee hereof and entitled "A BICMOS Bit Line Load for a Memory with Improved Reliability and a Method Therefor".

FIELD OF THE INVENTION

This invention relates generally to memories having a read mode and a write mode, and more particularly, to memories storing data bits in memory cells and providing data to and receiving data from these memory cells via pairs of complementary signal lines.

BACKGROUND OF THE INVENTION

In an MOS static random access memory (SRAM), a data bit of a memory cell is typically read and written by a signal represented as a differential voltage between two bit lines. Multiple memory cells are coupled to one bit line pair and form a column of the memory, with each memory cell located on one row of the column. Each memory cell has a unique address at an intersection of a row and a column. The bit line pairs are commonly used for both reading data from and writing data to the memory cell. When a write cycle occurs, the data bit is driven onto the bit line pair as a differential voltage between the two bit lines. The differential voltage is large enough to overwrite an existing value in the selected memory cell. Typically the differential voltage on the bit lines during the write cycle is approximately 3 volts. When a read cycle takes place, a selected memory cell places a data bit stored within the selected memory cell on the bit line pairs differentially also, but the differential voltage for the read cycle is relatively small and may be below 100 millivolts.

When a write cycle is completed, a read cycle begins, and the differential voltage remaining on the bit line pair at the end of the write cycle must be reduced to a level low enough so that the data is not erroneously written into a memory during the ensuing read cycle. The differential voltage on the bit line pair must also be reduced quickly so that the read cycle is not unnecessarily extended. This process is called write recovery. Write recovery may include either coupling a first bit line of a bit line pair to a second bit line of the bit line pair so that their voltages will approach each other (known as equalization), or coupling both lines to a reference voltage, commonly a 5-volt power supply voltage terminal $V_{DD}$ (known as precharging), or both. However achieved, write recovery must make the voltages on the first and second bit lines of the bit line pair close enough so that data is not overwritten and that the correct data is sensed quickly during the read cycle.

Write recovery is typically achieved by circuits known as bit line loads, which are coupled to each bit line pair. At the termination of the write cycle the bit line loads either couple the first bit line to the second bit line of the bit line pairs, or coupled each bit line to a power supply voltage terminal such as $V_{DD}$, or both. A data bit to be written onto the bit line pair during a write cycle may also be provided through the bit line load. In this case, the bit line load also functions as a write gate. If bipolar-CMOS (BICMOS) technology is available, bipolar transistors, which are faster than corresponding CMOS transistors, may be used to precharge corresponding bit line pairs and to provide the write voltages.

Several problems are encountered in the design of a BICMOS bit line load and write gate. During the write cycle, the relatively large differential signal provided on the bit lines in order to overwrite the contents of a selected memory cell may exceed 3 volts. If a biasing signal provided to the bases of the bipolar transistors in the bit line loads is at a logic low when the emitters, coupled to the bit lines, are at a logic high, a large reverse bias may be developed on the base-emitter junctions of the bipolar transistors. Bipolar transistors degrade in the reverse biased condition and as reverse bias increases, the amount of degradation increases. Therefore using bipolar transistors is subject to reliability problems in that the transistors may degrade over time, ultimately resulting in a failure of the memory. Often the solution of the reliability problem creates other problems which must also be addressed.

SUMMARY OF THE INVENTION

Accordingly, there is provided, in one form, a combined bit line load and write gate coupled to a differential pair in a block of a memory, the memory for performing read cycles and write cycles, and comprising first and second portions, each of the first and second portions comprising first through sixth transistors. The first transistor has a first current electrode coupled to a power supply voltage terminal, a control electrode for receiving a local write signal, and a second current electrode. The second transistor has a first current electrode coupled to the second current electrode of the first transistor, a control electrode for receiving the local write signal, and a second current electrode coupled to a corresponding bit line of the differential bit line pair. The third transistor has a first current electrode coupled to the source of the second transistor, a control electrode for receiving the local write signal, and a second current electrode for receiving a corresponding data signal of a data signal pair. The fourth transistor has a first current electrode coupled to the second current electrode of the first transistor, a control electrode for receiving the local write signal, and a second current electrode for receiving the corresponding data signal. The fifth transistor has a collector coupled to the power supply voltage terminal, a base coupled to the drain of the first transistor, and an emitter coupled to the corresponding bit line. The sixth transistor has a first current electrode coupled to the power supply voltage terminal, a control electrode for receiving the local write signal, and a second current electrode coupled to the corresponding bit line.

These and other objects, features and advantages will be more clearly understood from the following detailed description taken in conjunction with the accompanying drawings.

Detailed Description of the Invention

Figure 1:
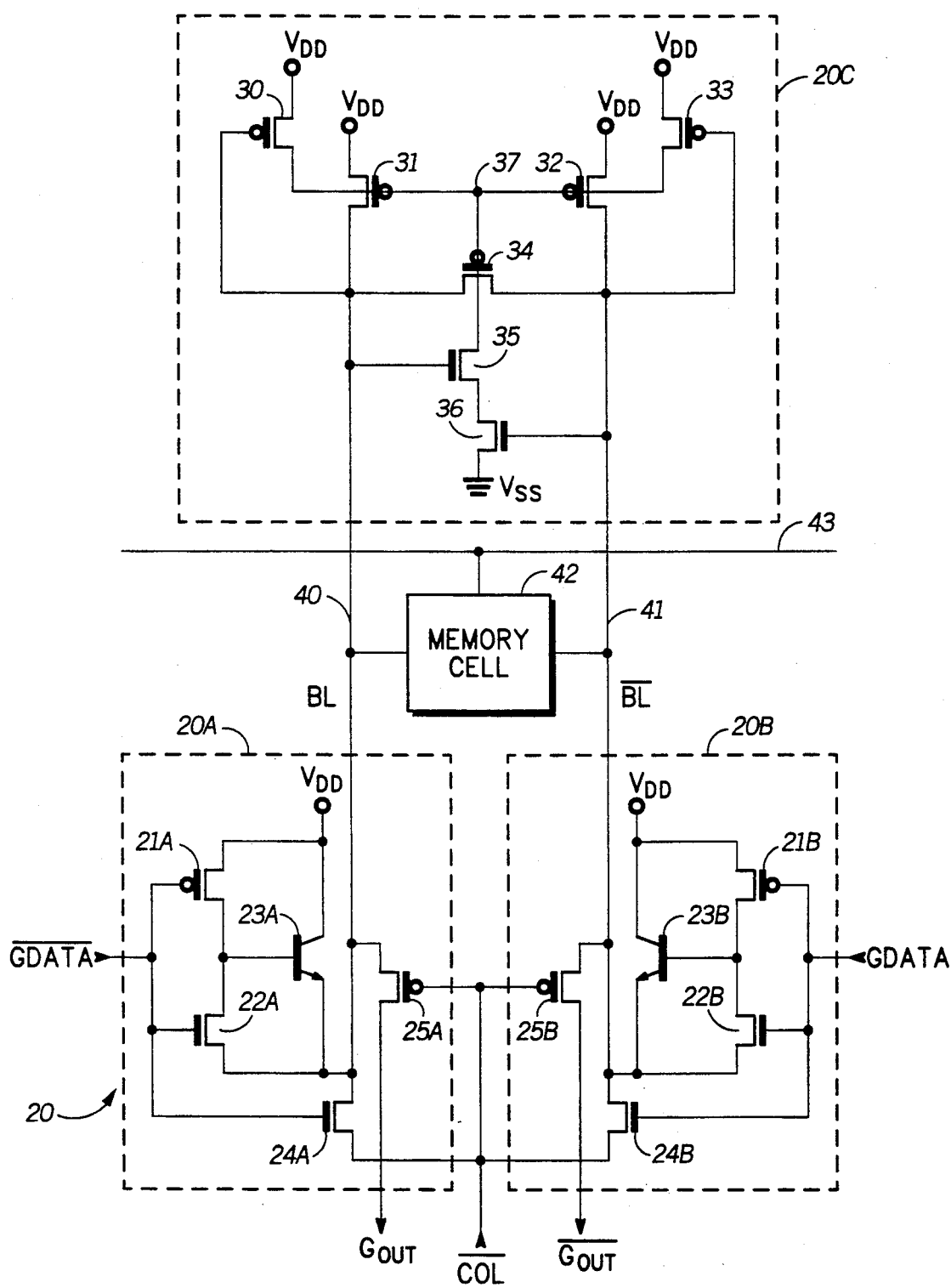
FIG. 1 illustrates in schematic form a portion of a memory including a BICMOS bit line load and write gate according to the prior art.

FIG. 1 illustrates in partial schematic and partial block form a portion of a memory including a BICMOS bit line load and write gate 20 according to the prior art. See Kertis et al. in 1990 *Symposium on VLSI Circuits*, pp. 41–42. Bit line load and write gate 20 includes two identical portions 20A and 20B, and a common portion 20C. Also shown in FIG. 1 is a differential bit line pair having bit lines 40 and 41, a representative memory cell 42 coupled thereto, and a word line 43 coupled to memory cell 42. Portion 20A has a P-channel transistor 21A, an N-channel transistor 22A, and NPN transistor 23A, an N-channel transistor 24A, and a P-channel transistor 25A. Portion 20B has a P-channel transistor 21B, an N-channel transistor 22B, and NPN transistor 23B, an N-channel transistor 24B, and a P-channel transistor 25B. Common portion 20C has P-channel transistors 30–34, and N-channel transistors 35 and 36.

In portion 20A, transistor 21A has a source connected to a power supply voltage terminal labelled "$V_{DD}$", a gate for receiving a data signal labelled "$\overline{GDATA}$", and a drain. $V_{DD}$ is a positive power supply voltage terminal and may be, for example, 5 volts. Transistor 22A has a drain connected to the drain of transistor 21A, a gate for receiving signal $\overline{GDATA}$, and a source for receiving a signal labelled "$\overline{COL}$". Transistor 23A has a collector connected to $V_{DD}$, a base connected to the drain of transistor 21A, and an emitter connected to bit line 40. Transistor 24A has a drain connected to bit line 40, a gate for receiving signal $\overline{GDATA}$, and a source for receiving signal $\overline{COL}$. Transistor 25A has a source connected to bit line 40, a gate for receiving signal $\overline{COL}$, and a drain for providing a read signal labelled "$G_{OUT}$". In portion 20B, transistor 21B has a source connected to $V_{DD}$, a gate for receiving a data signal labelled "GDATA", and a drain. Transistor 22B has a drain connected to the drain of transistor 21B, a gate for receiving signal GDATA, and a source for receiving signal $\overline{COL}$. Transistor 23B has a collector connected to $V_{DD}$, a base connected to the drain of transistor 21B, and an emitter connected to bit line 41. Transistor 24B has a drain connected to bit line 41, a gate for receiving signal GDATA, and a source for receiving signal $\overline{COL}$. Transistor 25B has a source connected to bit line 41, a gate for receiving signal $\overline{COL}$, and a drain for providing a read signal labelled "$\overline{G_{OUT}}$".

In common portion 20C, transistor 30 has a souce connected to $V_{DD}$, a gate connected to bit line 40, and a drain connected to a node 37. Transistor 31 has a source connected to $V_{DD}$, a gate connected to a node 37, and a drain connected to bit line 40. Transistor 32 has a source connected to $V_{DD}$, a gate connected to node 37, and a drain connected to bit line 41. Transistor 33 has a source connected to $V_{DD}$, a gate connected to bit line 41, and a drain connected to node 37. Transistor 34 has a source connected to bit line 40, a gate connected to node 37, and a drain connected to bit line 41.

Note that the designation of source and drain of transistor 34 is arbitrary and which current electrode functions as source and which current electrode functions as drain depends on the voltage applied. Transistor 35 has a drain connected to node 37, a gate connected to bit line 40, and a source. Transistor 36 has a drain connected to the source of transistor 35, a gate connected to bit line 41, and a source connected to a power supply voltage terminal labelled "$V_{SS}$". $V_{SS}$ is a negative power supply voltage terminal and is typically 0 volts.

In basic operation, bit line load and write gate 20 provides a data bit to memory cell 42 when selected during a write cycle, provides write recovery after termination of the write cycle, and provides an active load on bit lines 40 and 41 during a read cycle. Bit line load and write gate 20 performs the write recovery function by ensuring the relatively-large differential voltage developed between bit lines 40 and 41 during the write cycle is quickly reduced. The reduction is achieved by both an active pullup on bit lines 40 and 41 after the termination of the write cycle, and equalization between bit lines 40 and 41. Portions 20A and 20B are identical except that portion 20A receives data signal $\overline{GDATA}$ and is coupled to bit line 40 to provide signal BL thereon, and portion 20B receives data signal GDATA and is coupled to bit line 41 to provide signal $\overline{BL}$ thereon. Common portion 20C couples bit lines 40 and 41 together during write recovery and provides the active pullup during the read cycle.

During the write cycle, row and column decoding selects at least one memory cell. If row decoding activates word line 43, and if column decoding selects the column of bit lines 40 and 41 by activating $\overline{COL}$, then memory cell 42 is selected. The data to be written into memory cell 42 is received as a differential voltage between data signals GDATA and $\overline{GDATA}$. If a binary '1' is to be written into memory cell 42, signal GDATA is a logic high and signal $\overline{GDATA}$ a logic low. Transistor 21A is conductive and couples the base of transistor 23A to approximately $V_{DD}$. Transistors 22A and 24A are nonconductive. Transistor 23a remains conductive as long as BL is less than approximately $(V_{DD}-V_{Be})$, where $V_{BE}$ is equal to the forward biased base-to-emitter diode voltage drop of transistor 23A. (Note that in the following discussions, the forward biased base-to-emitter diode voltage drop of each bipolar transistor is assumed to be equal and is designated as $V_{BE}$. $V_{BE}$ is typically about 0.7 volts) GDATA is a logic high, and transistor 24B is conductive, coupling $\overline{BL}$ to a logic low. The base of transistor 23B is pulled to a logic low through transistors 22B. As soon as $\overline{BL}$ has reached a low enough voltage, transistor 36 becomes nonconductive, and the voltage on node 37 is pulled up by transistor 33 to approximately $V_{DD}$. Transistors 31, 32, and 34 thereby become nonconductive. If a binary '0' is to be written, the circuit functions in a symmetrical manner with corresponding events taking place on opposite bit lines and transistors.

At the end of the write cycle, a write recovery operation occurs. Both GDATA and $\overline{GDATA}$ are provided as a logic low. Thus, both transistor 23A and 23B are conductive to coupled bit lines 40 and 41 to $(V_{DD}-V_{BE})$. When the voltage on the bit line which was provided at a logic low during the preceding write cycle rises to a threshold voltage, $V_{TN}$, of corresponding transistor 35 or 36, node 37 is coupled to $V_{SS}$. (Note that in the following discussions, the threshold voltage of each N-channel transistor is assumed to be equal and is designated as $V_{TN}$. $V_{TN}$ is typically about 0.8 volts. However it should be apparent that transistor size, implant doping concentrations, etc. vary the actual threshold voltage of the corresponding transistor.) Transistors 31 and 32 become conductive to increase the voltages on bit lines 40 and 41 to approximately $V_{DD}$. Transistor 34 becomes conductive and couples bit line 41 to bit line 42 and thus equalizes the voltage therebetween. GDATA and $\overline{GDATA}$ are subsequently provided as a logic high.

During a read cycle in which memory cell 42 is selected, if a binary '1' is stored therein, a positive differential voltage between bit line 40 and bit line 41 is developed; if a binary '0' is stored therein, a negative differential voltage between bit line 41 and bit line 40 is developed. Transistors 25A and 25B become conductive, and the differential voltage between bit lines 40 and 41 is developed between signals $G_{OUT}$ and $\overline{G_{OUT}}$ to indicate the contents of memory cell 42. The differential voltage developed between BL and $\overline{BL}$ is relatively small during the read cycle, and may be approximately 90 millivolts.

There are at least four problems with bit line load and write gate 20 however. The first problem is caused by using inverters formed by transistors 21A and 22A (and corresponding transistors 21B and 22B) to prevent a reliability problem. If GDATA and $\overline{GDATA}$ were provided to the bases of transistors 23A and 23B directly, the base-emitter junctions of transistors 23A and 23B would be reversed biased by a relatively large voltage when GDATA and $\overline{GDATA}$ are provided as a logic low when the corresponding bit line is at a logic high. Bipolar transistors degrade in the reverse biased condition and as reverse bias increases, the amount of degradation increases. See, for example, "Hot-Carrier Degradation in Bipolar Transistors at 300 and 110K-Effect on BiCMOS Inverter Performance", by Burnett and Hu in *IEEE Transactions on Electron Devices*, vol. 37, No. 4, April 1990, pp. 1171–1173. The amount of degradation is proportional to the time the reverse bias occurs. Over time, the constant application of this large reverse bias may cause transistors 23A or 23B to fail, resulting in a failure of the entire memory.

In order to avoid the problem of large reverse bias, inverters formed by *transistors* 21A and 22A, and 21B and 22B were used. Thus, for example, when GDATA is a logic high, transistor 22A couples the base of transistor 23A to the emitter of transistor 23A to prevent a large reverse bias. However, another problem is created which may result in a failure of the memory under some circumstances. In N-channel MOS transistors, $V_{TN}$ is the voltage required to cause a conducting channel to be formed between source and drain. Thus if the gate to source voltage ($V_{GS}$) of an N-channel transistor exceeds $V_{TN}$, then the transistor is conductive. However, if a large voltage develops between the substrate and the source, a phenomenon known as the body effect, then $V_{TN}$ increases. Almost all commercial integrated circuits use grounded substrates. If the voltage on the source rises to three volts, for example, $V_{TN}$ may rise above 2.0 volts. Thus, GDATA and $\overline{GDATA}$ would have to be provided at the voltage of the bit line plus 2.0 volts to be conductive, or at ($V_{DD}$-$V_{BE}$+2.0). Since $V_{BE}$ is typically around 0.7 volts, a voltage above $V_{DD}$ would be required to make transistor 22A (or 22B) conductive. If actual circuit conditions such as parasitic resistance are considered, GDATA and $\overline{GDATA}$ will not even equal $V_{DD}$. The circumstance in which the body effect is a problem is during a write cycle when a logic low is being written onto a corresponding bit line. If a logic low is being written onto bit line 40, $\overline{GDATA}$ is a logic high; but due to the body effect, transistor 22A may not become conductive. Thus, transistor 23A may remain conductive and cause a logic high to remain on bit line 40, resulting in a failure of the memory.

A second problem is due to the ratioing of transistors 31 and 24A, and 32 and 24b. For example, when $\overline{GDATA}$ is at a logic high when memory cell 42 is selected by signal $\overline{COL}$ becoming active during the write cycle, transistor 24A becomes conductive. The voltage on bit line 40 is at that point determined in part by the gate sizing ratio of transistor 31 to transistor 24A. Under certain manufacturing conditions, when the threshold voltages of P-channel and N-channel transistors vary, the voltage on bit line 40 may be set high enough to prevent transistor 35 from becoming nonconductive, keeping transistor 31 conductive. Thus, ratioed transistors 31 and 24A (and 32 and 24B) may fail to provide a proper voltage on a bit line to which a logic low voltage is to be applied.

As the size of the memory of FIG. 1 increases, the resistance of bit lines 40 and 41 of FIG. 1, typically metal, increases, making the ratio problem worse by impeding the ability of transistors 24A and 24B to pull their respective bit lines low. The architecture of the memory of FIG. 1 relies upon the column and read and write information being provided to portions 20A and 20B at one end of bit lines 40 and 41. At the other end of bit lines 40 and 41, portion 20C performs the precharge and equalization functions of write recovery. Portion 20C does not rely on any control signals but performs the precharging and equalizing functions in response to changes in the voltages of bit lines 40 and 41. Thus the operation of portion 20C necessarily involves parasitic line resistance of bit lines 40 and 41, which worsens the ratio problem.

A third problem with bit line load and write gate 20 is that the memory in which bit line load and write gate 20 is located cannot easily be adapted for different data organizations. During the write cycle, column select signal $\overline{COL}$ sinks current drawn from the bit line to be provided as a logic low. In the case of a by-one (X1) memory, $\overline{COL}$ sinks current from only one bit line to be provided as a logic low. However, if the organization is chosen to be by-eight (X8), then $\overline{COL}$ must sink eight times the amount of current as if the organization were X1. Thus, either a circuit which decodes and provides $\overline{COL}$ must be able to tolerate an eight-to-one differential of current based on the organization, or the circuit must be redesigned for each data organization.

A fourth problem is the self-boosting of transistors 23A and 23B. Self-boosting occurs when the voltage on the base of a bipolar transistor increases rapidly, where the emitter is coupled to a highly capacitive load, such as a bit line. The base-emitter PN junction has an associated junction capacitance; when the voltage on the base is suddenly increased, a large base-emitter voltage is developed (since the highly capacitively load resists a sudden increase in voltage). The capacitance of a PN junction increases greatly when the $V_{BE}$ exceeds one diode voltage drop. Therefore, the base-emitter junction capacitance boosts the level of the base as the voltage at the emitter rises. In bit line load 20, self boosting occurs when $\overline{GDATA}$ switches to a logic low, causing transistor 21A to couple the base of transistor 23A to $V_{DD}$, when bit line 40 was previously a logic low. There is very little discharge path from the base electrode of the base emitter capacitance of transistor 23A because transistor 22A is nonconductive while the base current into transistor 23A is very small. Thus, the voltage on the base of transistor 23A may be boosted to an undesirable value.

Figure 2:
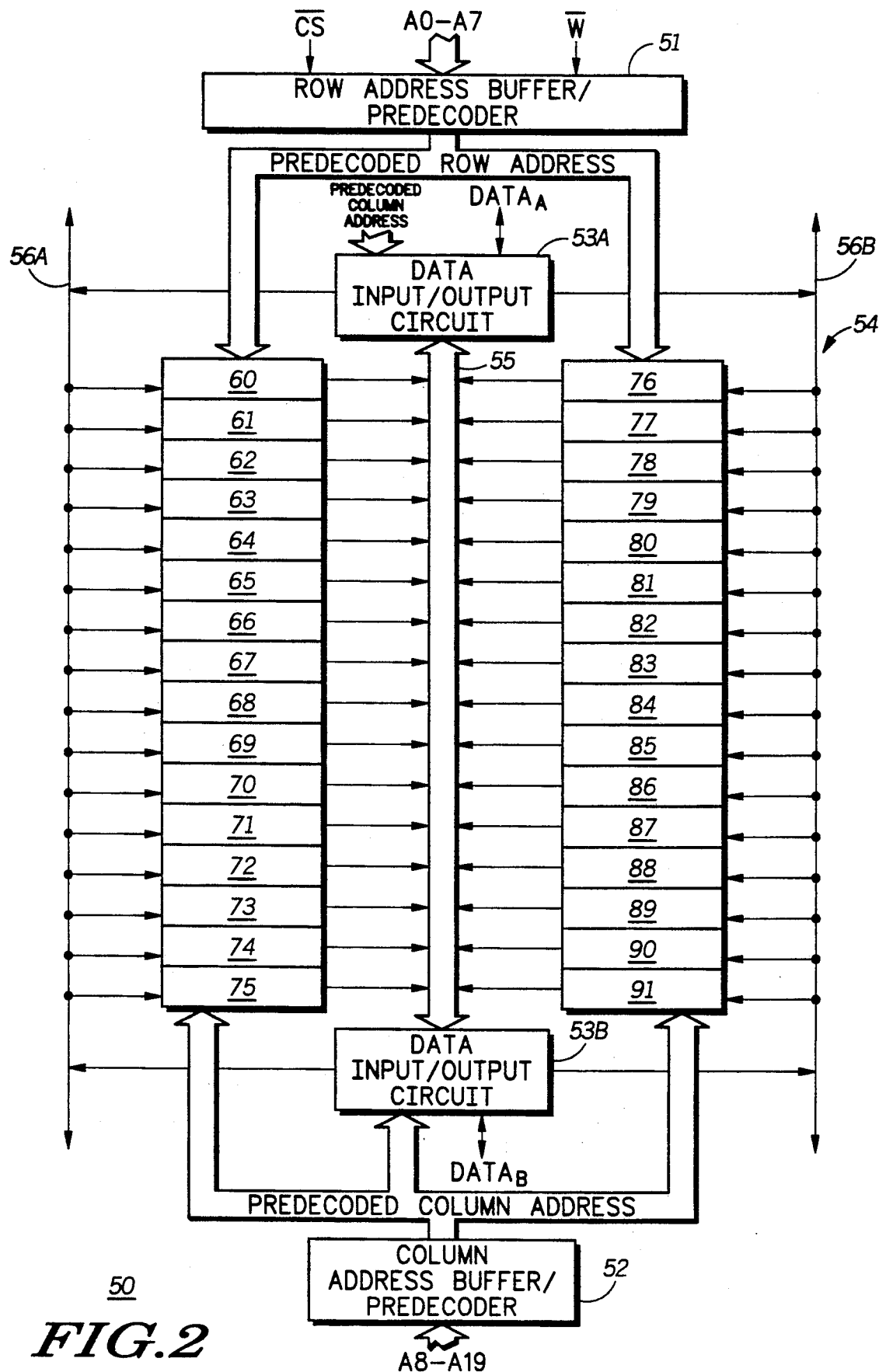
FIG. 2 illustrates in block form a memory incorporating the present invention.

FIG. 2 illustrates in block form a memory 50 incorporating the present invention. Memory 50 includes a row address buffer/predecoder 51, a column address buffer/predecoder 52, data input/output circuits 53A and 53B, a plurality of memory blocks 54, a plurality of read global data lines 55, and a pluralities of write global data lines 56A and 56B. Plurality of memory blocks 54 includes thirty-two memory blocks 60-91 in the illustrated embodiment. Row address buffer/predecoder 51 receives a plurality of address signals including eight address signals labelled "A0-A7". In response row address buffer/predecoder 51 provides a plurality of predecoded row address signals labelled "PREDECODED ROW ADDRESS" to each memory block. Likewise, column address buffer/predecoder 52 receives a plurality of address signals including twelve address signals labelled "A8-A19". In response column address buffer/predecoder 52 provides a plurality of predecoded column address signals labelled "PREDECODED COLUMN ADDRESS". It should be apparent that the particular address signals received by row address buffer/decoder 51 and column address buffer/decoder 52 have no special significance and may be different in other embodiments. It should also be apparent that the amount of decoding performed by either row or column decoding may also be varied in other embodiments. Each memory block receives PREDECODED ROW ADDRESS, PREDECODED COLUMN ADDRESS, and a plurality of differential signal pairs from corresponding write global data lines 56A or 56B, and provides a plurality of differential signal pairs to read global data lines 55. Read global data lines 55 conduct eight data signals represented as differential voltages between eight pairs of signal lines. Write global data lines 56A and 56B each conduct eight data signals represented as differential voltages between eight pairs of signal lines.

Memory 50 performs read cycles and write cycles. The read cycle is signified by control signal $\overline{CS}$ being asserted at a logic low, and control signal $\overline{W}$ being negated at a logic high. In response to signals $\overline{CS}$ and A0-A7, row address buffer/predecoder 51 provides 36 predecoded signals to select one of 512 rows in a selected memory block. Column address buffer/predecoder 52 provides thirteen predecoded column signals to each block. Within a selected block, the predecoded row address signals are further decoded to activate one of 512 word lines in a selected memory block. Column decoding selects eight memory cells within the selected memory block, and the contents of the eight selected memory cells are provided as differential signals between eight corresponding read global data line pairs in read global data lines 55. In other embodiments, a different number of memory cells may be selected. Data input/output circuit 53A then provides four signals designated as signal group $DATA_A$, while data input/output circuit 53B provides four signals designated as signal group $DATA_B$. Thus the data organization of memory 50 is X8.

Memory 50 conveniently supports other data organizations such as by-four (X4) and by-one (X1). Column address buffer/predecoder 52 receives additional address signals, and provides additional PREDECODED COLUMN ADDRESS signals to data input/output circuits 53A and 53B to further decode a portion of eight signals conducted on read global data lines 55. It should be apparent that if a X1 data organization is chosen, either data input/output circuit 53A or 53B would be unnecessary.

The write cycle is signified by both signals $\overline{CS}$ and $\overline{W}$ being active. In the write cycle, data input/output circuits 53A and 53B receive four bits each, designated respectively as signal groups $DATA_A$ and $DATA_B$. Each data signal $DATA_A$ and $DATA_B$ is then provided as a differential voltage between corresponding write global data line pairs to write global data lines 56A and 56B. Block selection, row, and column decoding proceed as in the read cycle to select one memory block and to provide predecoded signals to allow the selected memory block to couple the data to eight selected memory cells.

Figure 3:
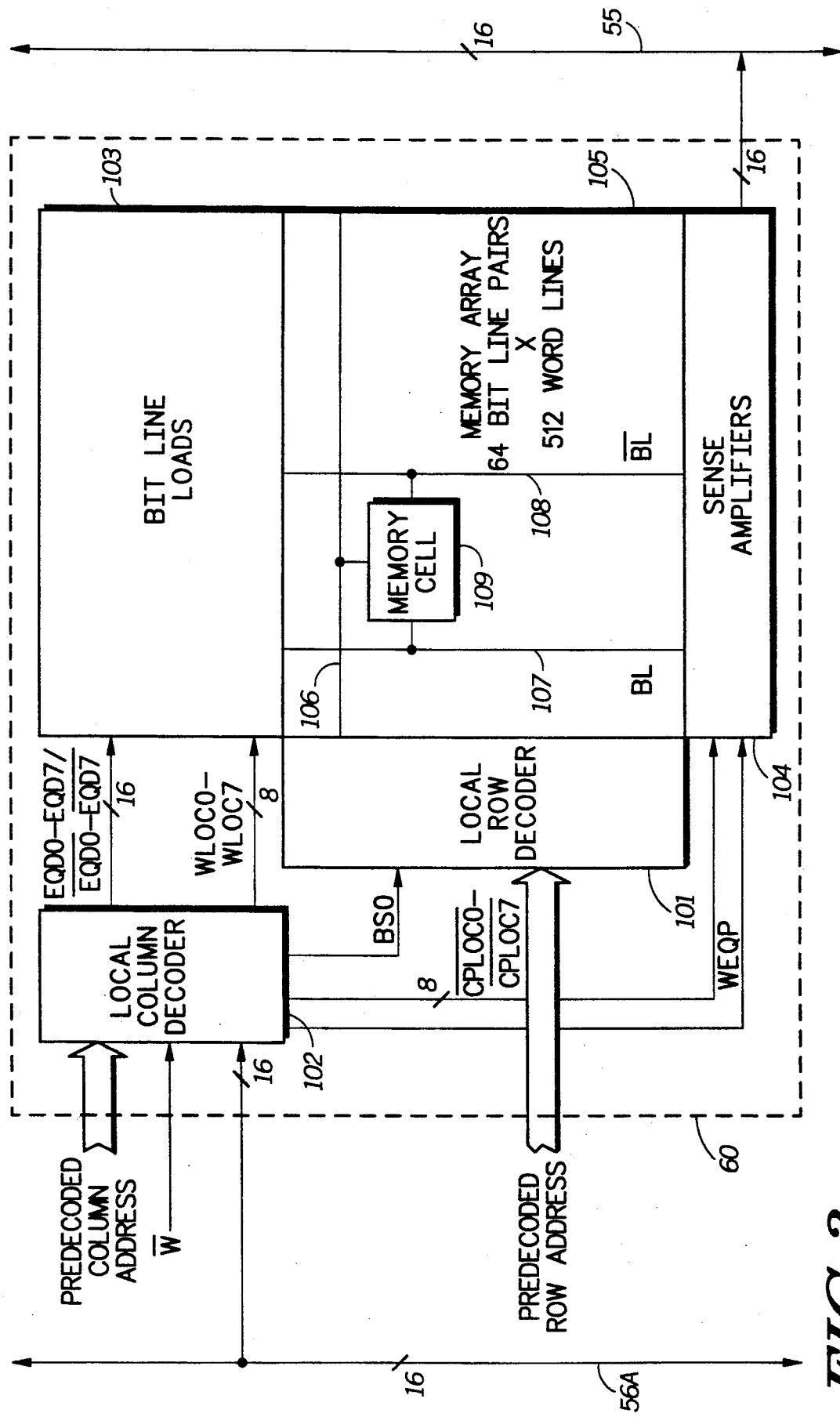
FIG. 3 illustrates in block form a memory block of the memory of FIG. 2.

FIG. 3 illustrates in block form memory block 60 of memory 50 of FIG. 2. Memory block 60 includes a local row decoder 101, a local block select and column decoder 102, a bit line load portion 103, a sense amplifier portion 104, and a memory array 105. Also shown in FIG. 3 are read global data lines 55, and write global data lines 56A, numbered as in FIG. 2. Memory array 105 includes a plurality of memory cells located at intersections of 64 bit line pairs and 512 word lines. In FIG. 3 an illustrative memory cell 109 is illustrated coupled to a word line 106 and a bit line pair including bit lines 107 and 108.

Local block select and row decoder 102 receives write signal $\overline{W}$ and the 36 predecoded column address signals, and couples to write global data lines 56A. In response, local block select and row decoder 102 provides a block select signal labelled "BS0", and selects one word line, of which word line 106 is an example. If word line 106 is selected during the read cycle, memory cell 109 provides a memory bit stored therein as a differential voltage between bit lines 107 and 108 in response. If a read cycle is indicated by signal $\overline{W}$ being inactive, local block select and column predecoder 102 provides decoded column signals labelled "$\overline{CPLOC0}$-$\overline{CPLOC7}$" in response to PREDECODED COLUMN ADDRESS, to sense amplifier portion 104. Sense amplifier portion 104 then decodes eight of 64 differential bit line pairs and provides eight differential signals on read global data lines 55. If a write cycle is indicated, local block select and column decoder 102 provides decoded column signals labelled "WLOC0-WLOC7" to bit line load portion 103. The data indicated by differential voltages on write global data lines 56A is provided as differential signal pairs labelled "EQD0-EQD7" and "$\overline{EQD0}$-$\overline{EQD7}$" to bit line load portion 103. Note that signals WLOC0-WLOC7 and EQD0-EQD7"and " $\overline{EQD0}$-$\overline{EQD7}$" are local to memory block 50. Bit line load portion 103 includes 64 combined bit line load and write gates. During the write cycle, selected bit line load and write gates provide differential voltages between corresponding bit lines in response to a data bit to be stored therein.

In memory block 60, sense amplifier portion 104 receives signal WEQP from local column decoder 102 to perform the equalization function of write recovery. Thus, the bit line load function is performed partially in bit line load portion 103 at one end of memory array 105, and partially at the other end of memory array 105. Performing the equalization function at the sense amplifier side of memory array 105 equalizes the voltages between bit lines 107 and 108 closer to where the data will be subsequently sensed. In the illustrated embodiment, layout considerations also favored placing the equalization function at the sense amplifier side.

Figure 4:
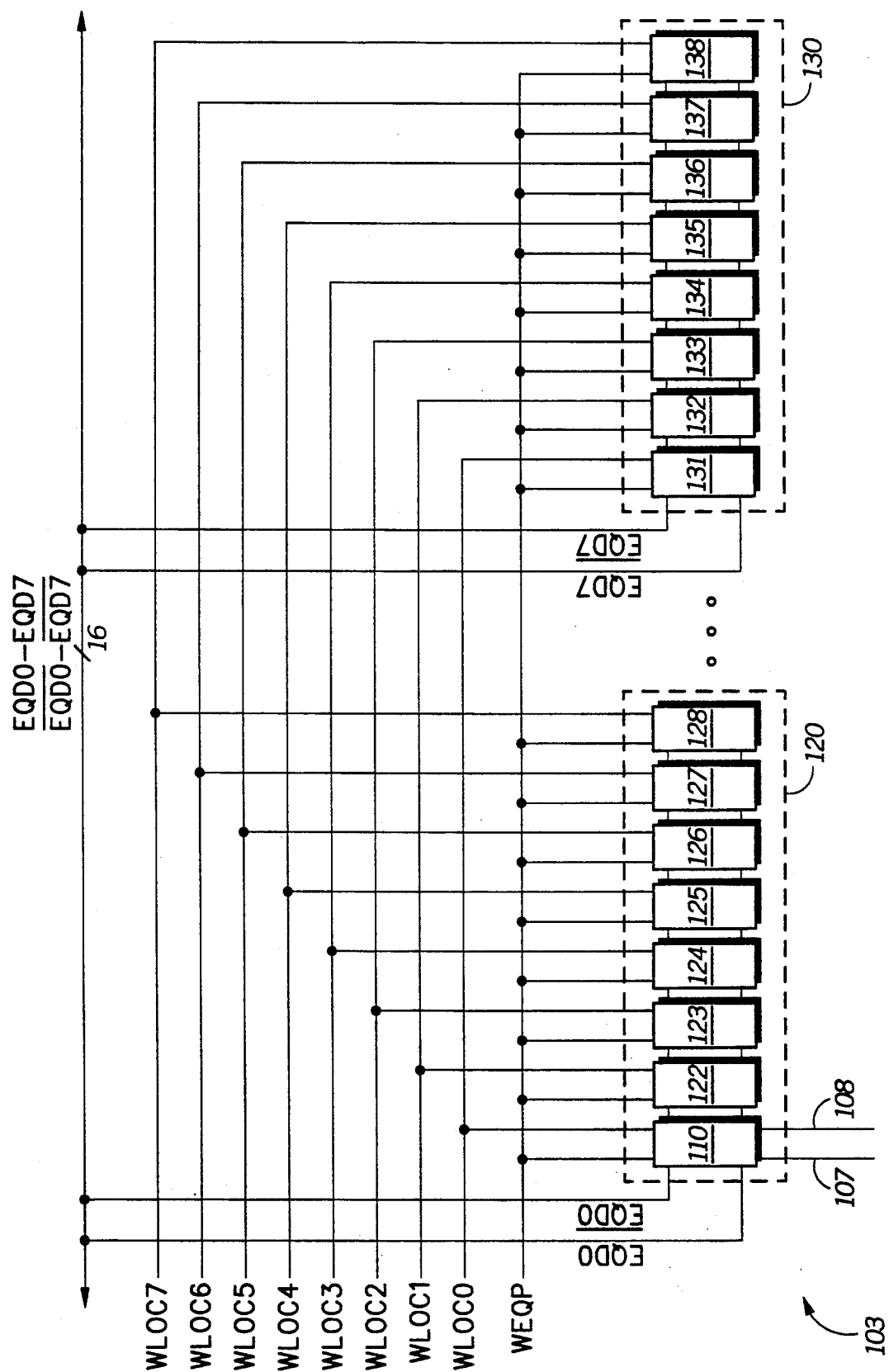
FIG. 4 illustrates in block form a portion of the memory block of FIG. 3 particularly illustrating column decoding.

FIG. 4 illustrates in block form bit line load portion 103 of memory block 60 of FIG. 3 particularly illustrating column decoding. Bit line load portion 103 has sixty-four combined bit line load and write gates, grouped together in groups of eight combined bit line load and write gates. Illustrated in FIG. 4 are groups 120 and 130. Group 120 has eight combined bit line load and write gates 110 and 122-128. Group 130 has eight combined bit line load and write gates 131-138. Each combined bit line load and write gate receives signal EQP. Note that in the actual layout of memory block 60, signal WEQP and the equalization function are actually performed on the opposite side of the bit lines; however, functionally WEQP performs part of the bit line load function and hereafter will be shown when referring to a combined bit line load and write gate of the present invention. Each combined bit line load and write gate in group 120 receives data signals EQD0 and $\overline{EQD0}$; each combined bit line load and write gate in group 130 receives data signals EQD7 and $\overline{EQD7}$; and each combined bit line load and write gate in six groups not illustrated in FIG. 4 receives a corresponding data signal pair of the remaining data signal pairs. Within each group, a first combined bit line load and write gate (such as 110 in group 120) receives signal WLOC0, a second (such as 122 in group 120) receives signal WLOC1, a third (such as 123 in group 120) receives signal WLOC2, and so on. Thus, signals WLOC0-WLOC7 are provided to one combined bit line load and write gate in each group. Finally, each combined bit line load and write gate couples to a differential bit line pair. FIG. 4 also illustrates bit lines 107 and 108 coupled to combined bit line load and write gate 110, numbered as in FIG. 3.

Figure 5:
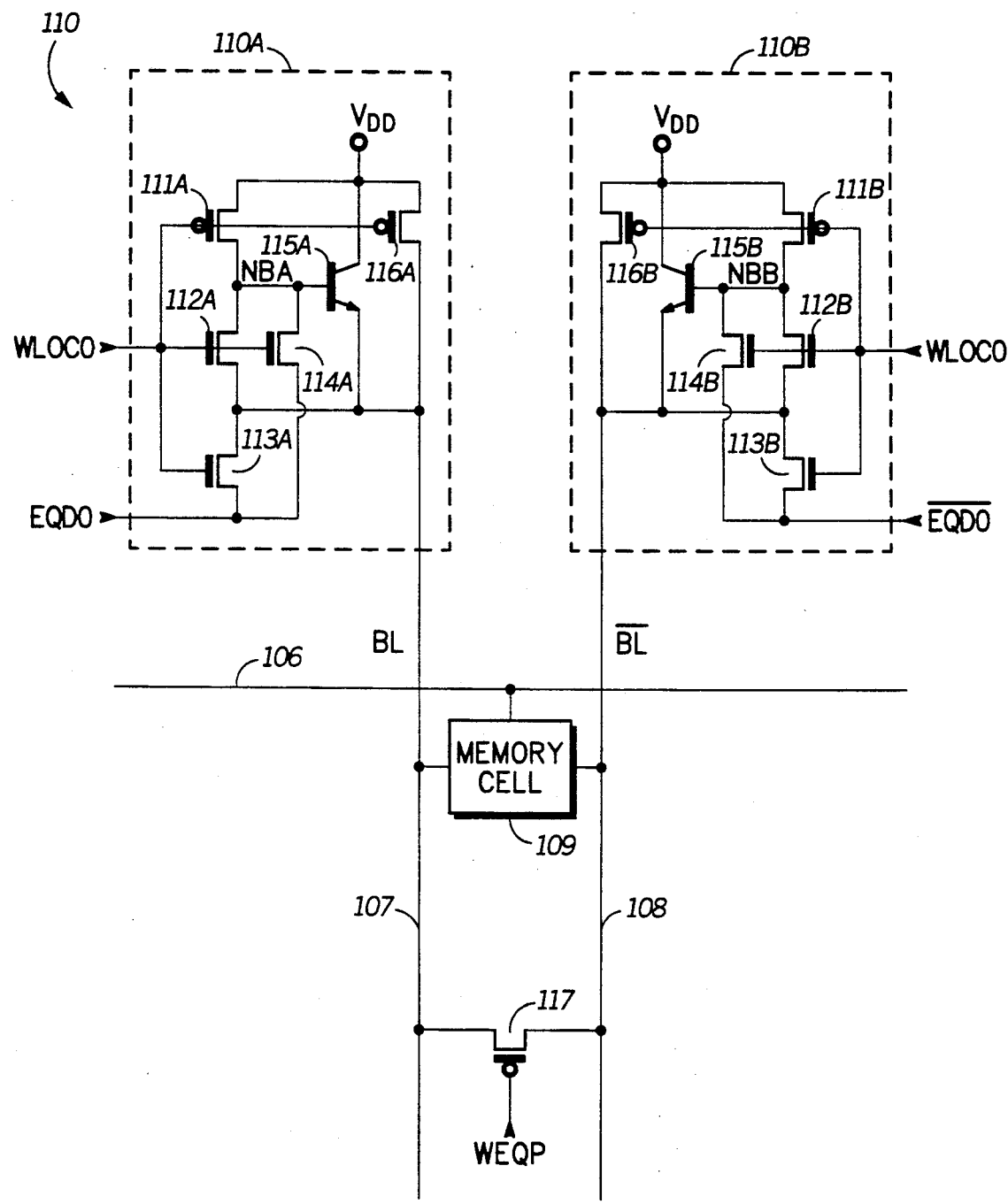
FIG. 5 illustrates in partial schematic form a BICMOS combined bit line load and write gate for the memory of FIG. 2 in accordance with the present invention.

FIG. 5 illustrates in schematic form a BICMOS combined bit line load and write gate 110 for memory 50 of FIG. 2 in accordance with the present invention. Combined bit line load and write gate 110 has a first portion 110A and a second portion 110B which are structurally identical but which receive different equalization signals, and a P-channel transistor 117. First portion 110A has a P-channel transistor 111A, N-channel transistors 112A, 113A, and 114A, and NPN transistor 115A, and a P-channel transistor 116A. Second portion 110B has a P-channel transistor 111B, N-channel transistors 112B, 113B, and 114B, and NPN transistor 115B, and a P-channel transistor 116B. In first portion 110A, transistor 111A has a source connected to $V_{DD}$, a gate for receiving local write signal WLOC0, and a drain connected to a node labelled "NBA". Transistor 112A has a drain connected to the drain of transistor 111A at node NBA, a gate for receiving WLOC0, and a source connected to bit line 107. Transistor 113A has a drain connected to the source of transistor 112A, a gate for receiving signal WLOC0, and a source for receiving a data signal labelled EQD0. Transistor 114A has a drain connected to the drain of transistor 111A at node NBA, a gate for receiving signal WLOC0, and a source for receiving signal EQD0. Transistor 115A has a collector connected to $V_{DD}$, a base connected to the drain of transistor 111A at node NBA, and an emitter connected to bit line 107. Transistor 116A has a source connected to $V_{DD}$, a gate for receiving WLOC0, and a drain connected to bit line 107. In second portion 110B, transistor 111B has a source connected to $V_{DD}$, a gate for receiving signal WLOC0, and a drain connected to a node labelled "NBB". Transistor 112B has a drain connected to the drain of transistor 111B at node NBB, a gate for receiving WLOC0, and a source connected to bit line 108. Transistor 113B has a drain connected to the source of transistor 112B, a gate for receiving signal WLOC0, and a source for receiving a data signal labelled $\overline{EQD0}$. Transistor 114B has a drain connected to the drain of transistor 111B at node NBB, a gate for receiving signal WLOC0, and a source for receiving signal $\overline{EQD0}$. Transistor 115B has a collector connected to $V_{DD}$, a base connected to the drain of transistor 111B at node NBB, and an emitter connected to bit line 108. Transistor 116B has a source connected to $V_{DD}$, a gate for receiving WLOC0, and a drain connected to bit line 108. Transistor 117 has a source connected to bit line 107, a gate for receiving a write equalization signal labelled WEQP, and a drain connected to bit line 108. Note that the designation of source and drain for some transistors is arbitrary and the current electrodes which function as source and drain will vary according to the voltages applied.

Portions 110A and 110B are structurally identical but receive different signals. While detailed reference will be made to portion 110A, it should be apparent that portion 110B functions identically when receiving corresponding input signals at the same voltages as portion 110A. Bit line load and write gate 110 performs the same functions as bit line load and write gate 20 of FIG. 1 while avoiding the problems associated therewith. During a read cycle, WLOC0 is inactive at a logic low. Transistor 111A is conductive, providing the voltage on the base of transistor 115A at approximately $V_{DD}$. Transistor 115A is conductive until the voltage on the emitter of transistor 115A rises to within one $V_{BE}$ of $V_{DD}$. Transistor 116A increases the voltage on bit line 107 above ($V_{DD}-V_{BE}$), to approximately $V_{DD}$. Portion 110B operates in the same way as portion 110A during the read cycle. When word line 106 is active, memory cell 109 provides a relatively-small differential voltage between bit lines 107 and 108 in response to the memory bit stored therein. WEQP is a logic high and thus transistor 117 is nonconductive.

During a write cycle, WLOC0 becomes active at a logic high to indicate that the column of bit lines 107 and 108 has been selected by column decoding. Transistors 111A, 111B, 116A, and 116B become nonconductive. The voltages on the gates of transistors 112A-114A and 112B-114B are each at a logic high. If a binary '1' is to be written to a selected memory cell, signal EQD0 is a logic high, and the voltage on bit line 107 is maintained (WLOC0-$V_{TN}$). At the same time signal $\overline{EQD0}$, received at the sources of transistors 113B and 114B, is a logic low. Under most manufacturing process conditions, transistors 112B, 113B, and 114B are each conductive. The voltage at node NBB is reduced through both transistor 114B, and transistors 112B and 113B. The voltage on the emitter of transistor 115B follows node NBB, and transistor 113B further reduces the voltage of $\overline{BL}$ to approximately $\overline{EQD0}$. Transistor 112B couples together the base and emitter of transistor 115B to prevent a large reverse bias from developing on the base-emitter junction of transistor 115B. Thus, bit line load and write gate 110 minimizes reliability problems of transistor 115B due to the application of a large reverse-bias to the base-emitter junction thereof. If a binary '0' is to be written to a selected memory cell, the voltages on data signals EQD0 and $\overline{\text{EQD0}}$ are reversed, and the operation of portions 110A and 110B is as described earlier for portions 110B and 110A, respectively. During a read cycle, transistors 116A and 116B function as loads to provide a differential voltage between bit lines 107 and 108 in response to a current conducted by memory cell 109 on corresponding bit lines when selected.

At the end of the write cycle, write recovery occurs. Signal WLOC0 becomes inactive at a logic low, and signals EQD0 and $\overline{\text{EQD0}}$ both become a logic high. Referring to portion 110A, transistors 112A, 113A, and 114A each become nonconductive. Transistors 111A and 116A are both conductive; transistor 111A couples the base of transistor 115A substantially to $V_{DD}$. If bit line 107 was provided at a logic low during the preceding write cycle, then transistor 115A becomes conductive to quickly increase the voltage on bit line 107 to approximately ($V_{DD}$-$V_{BE}$). When the voltage on bit line 107 reaches ($V_{DD}$-$V_{BE}$), transistor 115A becomes nonconductive and transistor 116A further increases the voltage on bit line 107 to approximately $V_{DD}$. During write recovery signal WEQP is provided at a logic low, and transistor 117 becomes conductive to couple bit line 107 to bit line 108. Thus, portions 110A and 110B perform the precharge function, and transistor 117 provides the equalization function, of write recovery. A short time later, WEQP becomes a logic high again in preparation for a subsequent read cycle.

Combined bit line load and write gate 110 improves the speed of write recovery over a CMOS-only design, and provides several improvements over the circuit of FIG. 1. A first improvement is that transistors 114A and 114B prevent a failure which might otherwise occur under some manufacturing process conditions due to the body effect. For example, if a binary '0' is to be written to a selected memory cell, BL is provided at a logic low. Signal WLOC0 is active at a logic high, and signal EQD0 is inactive at a logic low. To reduce BL, which is held at one $V_{BE}$ below node NBA, the voltage at node NBA must be reduced through transistor 112A. But the source of transistor 112A is connected to the emitter of transistor 115A. If the $V_{TN}$ of transistor 112A is too high in relation to the $V_{BE}$ of transistor 115A, because manufacturing process variations either cause a high $V_{TN}$ or worsen the body effect, transistor 112A may not become conductive enough to provide the required separation in voltage between the bit lines, of approximately 3.0 volts, by the end of the write cycle. Thus, under certain manufacturing process conditions, without transistors 114A and 114B, the memory may fail. However, the source of transistor 114A receives signal EQD0, at a logic low, and thus transistor 114A is not subject to the body effect. Furthermore, since WLOC0 is at a logic high and EQD0 is at a logic low, transistor 114A is strongly conductive even when the manufacturing process causes high $V_{TN}$s. Thus, the addition of transistor 114A (and corresponding transistor 114B) prevents failures of combined bit line load and write gate 110 under certain conditions. It should be apparent that the width-to-length (W/L) sizings of transistors 114A and 114B should be small in relation to the W/L sizings of transistors 112A and 112B, respectively.

A second improvement is that bit line load and write gate 110 does not control the load state on either bit line 40 or bit line 41 by a ratio between the gate sizes of two transistors, but only by transistors 116A and 116B. Transistors 116A and 113A (and transistors 116B and 113B) are not both simultaneously conductive because they are of opposite conductivity types and are controlled by the same signal.

A third improvement is that bit line load and write gate 110 does not create a difference in current depending on the data organization employed. Signal WLOC0 is provided only to the gates of transistors, and thus no appreciable current is drawn therefrom. Furthermore, signals EQD0 and $\overline{\text{EQD0}}$ provide current only to a selected bit line. Thus, there is no variation in current due to a change in data organization.

A fourth improvement is that bit line load and write gate 110 provides extra protection against self-boosting over that of bit line load and write gate 20 of FIG. 1. Bipolar transistors 23A and 23B of circuit 20 of FIG. 1 are active during the write cycle, while transistor 34 is nonconductive. Thus the entire increase in voltage of the bit lines, from a logic low to ($V_{DD}$-$V_{BE}$), must be accomplished by current conducted through the base-emitter diode of transistor 23A or 23B. In the embodiment of bit line load and write gate 110 illustrated in FIG. 5, however, transistors 115A of 115B are active only during write recovery. During write recovery, transistor 117 is also active to couple bit line 107 to bit line 108. If, for example, a logic low is present on bit line 107 during write recovery, a logic high will be present on bit line 108. Transistor 117 is conductive during write recovery and the voltage on bit line 107 is increased both through the base-emitter diode of transistor 115A, and by bit line 108 through transistor 117. Thus, the large voltage difference developed across the base-emitter junction when a bipolar transistor switches a highly capacitive load, which causes a large junction capacitance and self boosting, is reduced by the coupling of bit line 107 to bit line 108 through transistor 117.

Transistor 117, made conductive by WEQP (which is a logic low only during write recovery) provides two additional improvements. The first additional improvement is a decrease in temperature dependence. As temperature increases, the voltage on the bit line, which was provided at a logic low during the write cycle, at the end of write recovery, increases. Transistor 117 assists write recovery by coupling the bit lines together and more quickly decreasing the differential voltage therebetween, and thus diminishes the variation due to changes in temperature. The second additional improvement is that the pulsed nature of signal WEQP during write recovery solves a tradeoff in the sizing of transistor 117. If transistor 117 were conductive at any time except during a write cycle, then the effective resistance must be large enough to allow an adequate voltage differential to be developed between bit lines 107 and 108 during the read cycle, yet small enough to properly couple together bit lines 107 and 108 during write recovery. As the number of memory cells coupled to bit lines 107 and 108 increases, the capacitances to ground on bit lines 107 and 108 increases, and the range of sizes of transistor 117 which would allow proper voltage development during the read cycle and write recovery decreases. Above a number of memory cells, no size of transistor 117 ensures proper voltages during both the read cycle and write recovery. Thus, transistor 117, made conductive and nonconductive at appropriate times by signal WEQP, ensures proper development of read cycle and write recovery voltages between bit lines 107 and 108.

Figure 6:
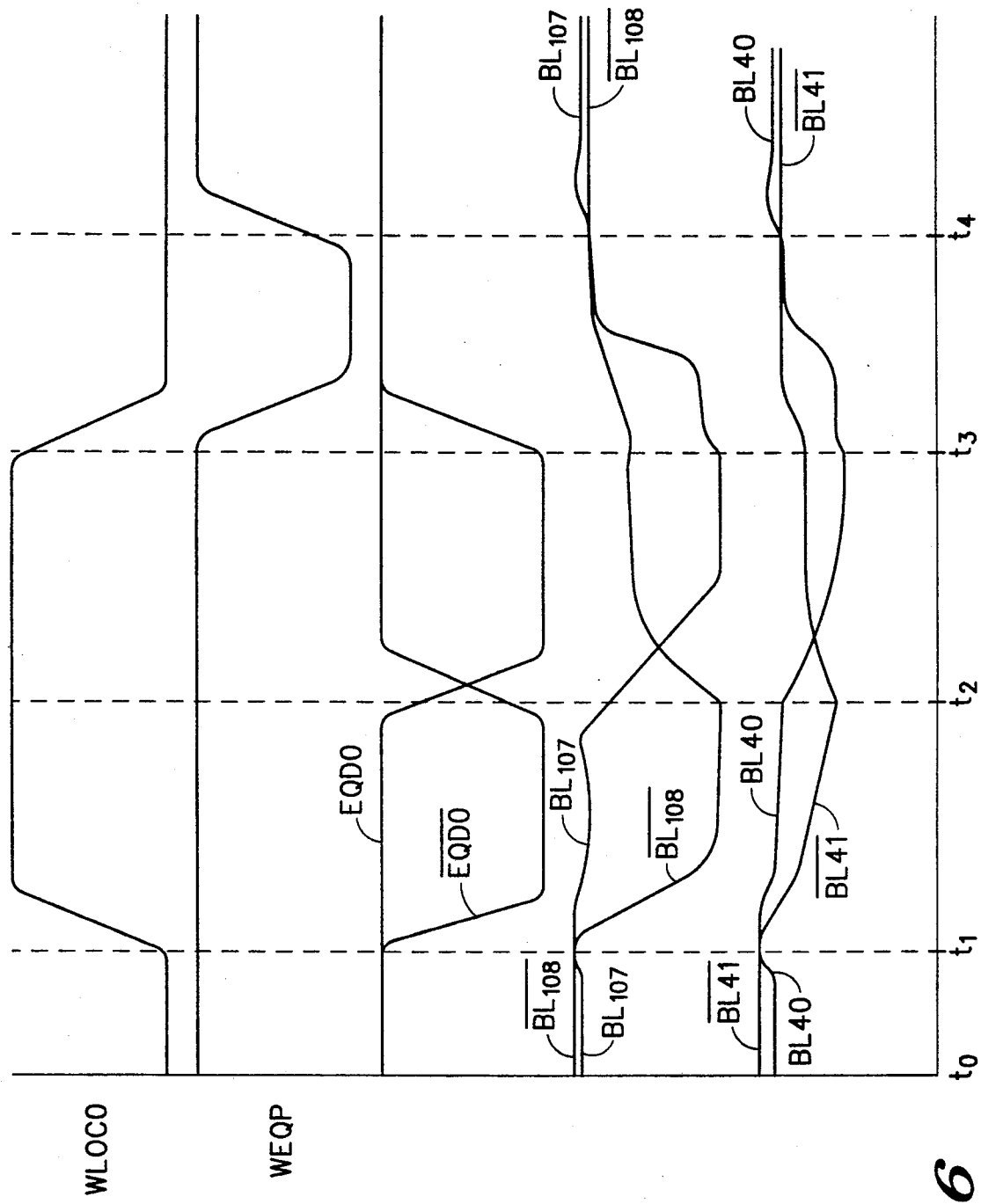
FIG. 6 illustrates a timing diagram of signals pertinent to FIG. 5.

FIG. 6 illustrates a timing diagram of signals pertinent to FIG. 5. In FIG. 6, the vertical axis illustrates various signal voltages pertaining to combined bit line load and write gate 110 of FIG. 5, including signals WLOC0, WEQP, EQD0, $\overline{EQD0}$, BL$_{107}$, and $\overline{BL_{108}}$, where BL$_{107}$ is the voltage of bit line 107, and $\overline{BL_{108}}$ is the voltage of bit line 108. The horizontal axis represents time, demarked by time points labelled "t0", "t1", "t2", "t3", and "t4". In the context of memory 50 of FIG. 2, the time shown between t0 and t1 represents the completion of a read cycle of a binary '0', the time from t1 to t2 represents a write cycle with a binary '1' being written on bit lines 107 and 108, the time from t2 to t3 represents a write cycle with a binary '0' being written on bit lines 107 and 108, the time from t3 to t4 represents a write recovery cycle, and the time after t4 represents a read cycle of a binary '1' on bit lines 107 and 108.

During the first read cycle, a binary '0' is indicated by a small differential voltage between $\overline{BL_{108}}$ and BL$_{107}$. At the beginning of the first write cycle, at t1, signal WLOC0 becomes active at a logic high, and a positive voltage is provided between signals EQD0 and $\overline{EQD0}$. In response, a positive differential voltage is developed between bit line signals BL$_{107}$ and $\overline{BL_{108}}$. In the case of two consecutive write cycles, illustrated in FIG. 6, signal WLOC0 remains asserted for both write cycles. In the subsequent write cycle in which a binary '0' is to be written, the differential voltages between signals EQD0 and $\overline{EQD0}$, and hence between BL$_{107}$ and $\overline{BL_{108}}$, are reversed. At time t3, the write cycle is terminated by signal WLOC0 becoming inactive and data signals EQD0 and $\overline{EQD0}$ both being provided at a logic high, and write recovery begins. Active pullup through bipolar transistors 115A and 115B occurs, as well as a coupling between bit lines 107 and 108 in response to WEQP being active. As soon as bit lines 107 and 108 reach a voltage of approximately ($V_{DD}-V_{BE}$), transistors 115A and 115B become inactive and any further increase in voltage of bit lines 107 and 108 is accomplished by transistors 116A and 116B. At the end of write recovery, WEQP becomes inactive. In the subsequent read cycle, a differential voltage developed between signals BL$_{107}$ and $\overline{BL_{108}}$ indicates the contents of the selected memory cell. In the illustrated example, a binary '1' is indicated in a read cycle following a write cycle in which a binary '0' was provided. It should be apparent that different memory cells coupled to bit lines 107 and 108 are being accessed.

In addition, FIG. 6 illustrates two additional bit line voltages labelled "BL$_{40}$" and $\overline{BL_{41}}$. Voltages BL$_{40}$ and $\overline{BL_{41}}$ are voltages which would be present on bit lines 40 and 41 of FIG. 1 under certain manufacturing conditions (which worsen the body effect, increase $V_{TN}$s, and reduce the logic high voltages of GDATA and $\overline{GDATA}$). During the write cycle, when a binary '1' is to be written to a selected memory cell between times t1 and t2, voltage $\overline{BL_{41}}$ decreases slowly, and by time t2, the differential voltage between BL$_{40}$ and $\overline{BL_{41}}$ is not sufficiently large to cause a binary '1' to be written to a selected memory cell. Similarly, when a binary '0' is to be written to the selected memory cell between times t2 and t3, voltage BL$_{40}$ decreases slowly, and by time t3, the differential voltage between $\overline{BL_{41}}$ and BL$_{40}$ is not sufficiently large to cause a binary '0' to be written to a selected memory cell. Thus, transistors 114A and 114B improve the speed of the write operation and prevent failures which occur under certain manufacturing conditions.

It should be apparent by now that a BICMOS combined bit line load and write gate for a memory has been described. The bit line load includes two portions coupled respectively to first and second bit lines of a bit line pair. In addition, a transistor to equalize a voltage between the two bit lines in response to a pulse signal provided at the termination of the write cycle is provided. The bit line load and write gate of the present invention provides fast write recovery due to a bipolar pullup transistor, and in addition addresses four problems existing in known bit line load and write gate circuits. The BICMOS combined bit line load and write gate of the present invention prevents failure due to the body effect, avoids failure due to manufacturing variations which occur due to ratioing of transistors, provides the ability to adapt the memory to different data organizations, and prevents of self boosting of the base of the bipolar transistor.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A combined bit line load and write gate coupled to a differential bit line pair in a memory, the memory for performing read cycles and write cycles, comprising:

a first transistor having a first current electrode coupled to a power supply voltage terminal, a control electrode for receiving a local write signal, and a second current electrode;

a second transistor having a first current electrode coupled to said second current electrode of said first transistor, a control electrode for receiving said local write signal, and a second current electrode coupled to a bit line of the differential bit line pair;

a third transistor having a first current electrode coupled to said second current electrode of said second transistor, a control electrode for receiving said local write signal, and a second current electrode for receiving a data signal of a data signal pair;

a fourth transistor having a first current electrode coupled to said second current electrode of said first transistor, a control electrode for receiving said local write signal, and a second current electrode for receiving said data signal;

a fifth transistor having a collector coupled to said power supply voltage terminal, a base coupled to said second current electrode of said first transistor, and an emitter coupled to said bit line; and a sixth transistor having a first current electrode coupled to said power supply voltage terminal, a control electrode for receiving said local write signal, and a second current electrode coupled to said bit line.

2. The combined bit line load and write gate of claim 1 further comprising a seventh transistor having a first current electrode coupled to said bit line of the bit line pair, a control electrode for receiving an equalization pulse signal, and a second current electrode coupled to a second bit line of the bit line pair.

3. In a memory for performing read cycles and write cycles comprising:

column decoding means for providing a local write signal when a differential bit line pair is selected during the write cycle; and means for providing a differential data signal pair either in response to a logic value to be stored during the write cycle, or providing each data signal of said differential data signal pair at a logic high otherwise, a combined bit line load and write gate coupled to a differential bit line pair, having first and second portions, the first portion receiving a true data signal of a data signal pair and coupled to a true bit line of the differential bit line pair, the second portion receiving a complement data signal of the data signal pair and coupled to a complement bit line of the differential bit line pair, each of the first and second portions comprising:

a first transistor having a first current electrode coupled to a power supply voltage terminal, a control electrode for receiving said local write signal, and a second current electrode;

a second transistor having a first current electrode coupled to said second current electrode of said first transistor, a control electrode for receiving said local write signal, and a second current electrode coupled to a corresponding bit line of the differential bit line pair;

a third transistor having a first current electrode coupled to said second current electrode of said second transistor, a control electrode for receiving said local write signal, and a second current electrode for receiving a corresponding data signal of the differential data signal pair;

a fourth transistor having a first current electrode coupled to said second current electrode of said first transistor, a control electrode for receiving said local write signal, and a second current electrode for receiving said corresponding data signal;

a fifth transistor having a collector coupled to said power supply voltage terminal, a base coupled to said second current electrode of said first transistor, and an emitter coupled to said corresponding bit line; and a sixth transistor having a first current electrode coupled to said power supply voltage terminal, a control electrode for receiving said local write signal, and a second current electrode coupled to said corresponding bit line.

4. The combined bit line load and write gate of claim 3 further comprising:

means for providing an equalization pulse signal in response to a termination of the write cycle; and a seventh transistor having a first current electrode coupled to the true bit line of the differential bit line pair, a control electrode for receiving said equalization signal, and a second current electrode coupled to the complement bit line of the differential bit line pair.

5. In a memory having a plurality of memory blocks, each block comprising:

a plurality of memory cells located at intersections of a plurality of word lines and a plurality of differential bit line pairs;

decoding means for selecting at least one word line and at least one differential bit line pair, a selected memory cell located at an intersection of a selected word line and a selected bit line pair;

means for providing a local write signal when the memory block is selected during a write cycle; and means for providing a data signal pair either in response to a logic state of a data bit to be stored during said write cycle, or at a logic high otherwise;

a plurality of combined bit line loads and write gates coupled to the plurality of differential bit line pairs, each combined bit line load and write gate comprising first and second portions, the first portion receiving a true data signal of a data signal pair and coupled to a true bit line of the differential bit line pair, the second portion receiving a complement data signal of the data signal pair and coupled to a complement bit line of the differential bit line pair, each of the first and second portions comprising:

a first transistor having a source coupled to a power supply voltage terminal, a gate for receiving said local write signal, and a drain;

a second transistor having a drain coupled to said drain of said first transistor, a gate for receiving said local write signal, and a source coupled to a corresponding bit line of the differential bit line pair;

a third transistor having a first current electrode coupled to said source of said second transistor, a control electrode for receiving said local write signal, and a second current electrode for receiving a corresponding data signal of the data signal pair;

a fourth transistor having a drain coupled to said drain of said first transistor, a gate for receiving said local write signal, and a source for receiving said corresponding data signal;

a fifth transistor having a collector coupled to said power supply voltage terminal, a base coupled to said drain of said first transistor, and an emitter coupled to said corresponding bit line; and a sixth transistor having a source coupled to said power supply voltage terminal, a gate for receiving said local write signal, and a drain coupled to said corresponding bit line.

6. In the memory of claim 5, wherein the combined bit line load and write gate further comprises:

means for providing an equalization pulse signal in response to a termination of said write cycle; and a seventh transistor having a first current electrode coupled to the true bit line of the differential bit line pair, a control electrode for receiving said equalization signal, and a second current electrode coupled to the complement bit line of the differential bit line pair.

* * * * *